(12) United States Patent
Minamio et al.

(10) Patent No.: US 8,686,545 B2
(45) Date of Patent: Apr. 1, 2014

(54) SEMICONDUCTOR DEVICE AND METHOD FOR MANUFACTURING THE SAME

(75) Inventors: Masanori Minamio, Osaka (JP); Tatsuo Sasaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 123 days.

(21) Appl. No.: 13/394,430

(22) PCT Filed: Jul. 21, 2011

(86) PCT No.: PCT/JP2011/004126
§ 371 (c)(1),
(2), (4) Date: Mar. 6, 2012

(87) PCT Pub. No.: WO2012/023236
PCT Pub. Date: Feb. 23, 2012

(65) Prior Publication Data
US 2012/0161302 A1 Jun. 28, 2012

(30) Foreign Application Priority Data
Aug. 20, 2010 (JP) ................... 2010-184603

(51) Int. Cl.
*H01L 23/495* (2006.01)
*H01L 21/00* (2006.01)

(52) U.S. Cl.
USPC .... 257/675; 257/666; 257/796; 257/E23.032; 257/E23.051; 257/E23.067; 257/E21.505; 257/E21.506; 438/122; 438/123

(58) Field of Classification Search
USPC ......... 257/276, 625, 706, 707, 712–722, 796, 257/E33.075, E31.131, E23.08–E23.113, 257/666–677, E23.031–E23.059; 438/122, 438/123, FOR. 413, 111, 112, FOR. 366, 438/FOR. 367, FOR. 377, FOR. 380
See application file for complete search history.

(56) References Cited

U.S. PATENT DOCUMENTS

| 5,483,098 | A | 1/1996 | Joiner, Jr. | |
| 6,512,286 | B1 * | 1/2003 | Tsai et al. | 257/666 |
| 8,058,706 | B2 * | 11/2011 | Feng et al. | 257/618 |
| 2003/0141575 | A1 * | 7/2003 | Yu et al. | 257/666 |
| 2005/0035447 | A1 | 2/2005 | Basho et al. | |

FOREIGN PATENT DOCUMENTS

| EP | 0 484 180 A1 | 5/1992 |
| JP | 48-075567 | 9/1973 |
| JP | 04-006860 | 1/1992 |
| JP | 4-168753 | 6/1992 |
| JP | 05-218133 | 8/1993 |
| JP | 06-326236 | 11/1994 |
| JP | 07-211818 | 8/1995 |
| JP | 11-251494 | 9/1999 |
| JP | 2004-063561 | 2/2004 |
| JP | 2004-087612 | 3/2004 |

OTHER PUBLICATIONS

International Search Report issued in International Patent Application No. PCT/JP2011/004126 dated Oct. 18, 2011.

* cited by examiner

*Primary Examiner* — Jasmine Clark
(74) *Attorney, Agent, or Firm* — McDermott Will & Emery LLP (57) ABSTRACT

A semiconductor device according to the present disclosure includes: a plate (13) having a through hole (15); a metal column (16) fixed to the through hole with an insulating member (17) interposed therebetween, and having a projection projecting from the upper surface of the plate; a semiconductor element (12) fixed to the projection; a lead frame (11) electrically connected to the semiconductor element; and a package (14) covering the semiconductor element, and also covering at least part of each of the plate, the metal column, and the lead frame. The lower surface (13b) of the plate is exposed from the package.

17 Claims, 8 Drawing Sheets

FIG.15
PRIOR ART ated in FIG. 14, the semiconductor device of Patent Document 2 has a heat dissipation structure in which a die pad 202 on which a semiconductor element 201 having a large calorific value is mounted is connected to a heat dissipation member 203 and the heat dissipation member 203 is partially exposed from an encapsulating resin 204 sealing the semiconductor element 201.
SEMICONDUCTOR DEVICE AND METHOD FOR MANUFACTURING THE SAME

RELATED APPLICATIONS

This application is the U.S. National Phase under 35 U.S.C. §371 of International Application No. PCT/JP 2011/004126, filed on Jul. 21, 2011, which in turn claims the benefit of Japanese Application No. 2010-184603, filed on Aug. 20, 2010, the disclosures of which Applications are incorporated by reference herein.

TECHNICAL FIELD

The present disclosure relates to a semiconductor device in which a semiconductor element is sealed in a package and a method for manufacturing the semiconductor device.

BACKGROUND ART

Recent semiconductor elements to be incorporated in an inverter control device or other devices need to have higher densities and operate at higher speed. However, the increases in density and speed of semiconductor elements cause a rise in calorific values of the semiconductor elements, thereby creating the possibility of degradation in operational reliability of the semiconductor elements. In view of this, a heat dissipation structure incorporating semiconductor elements has become important.

Figure 13:
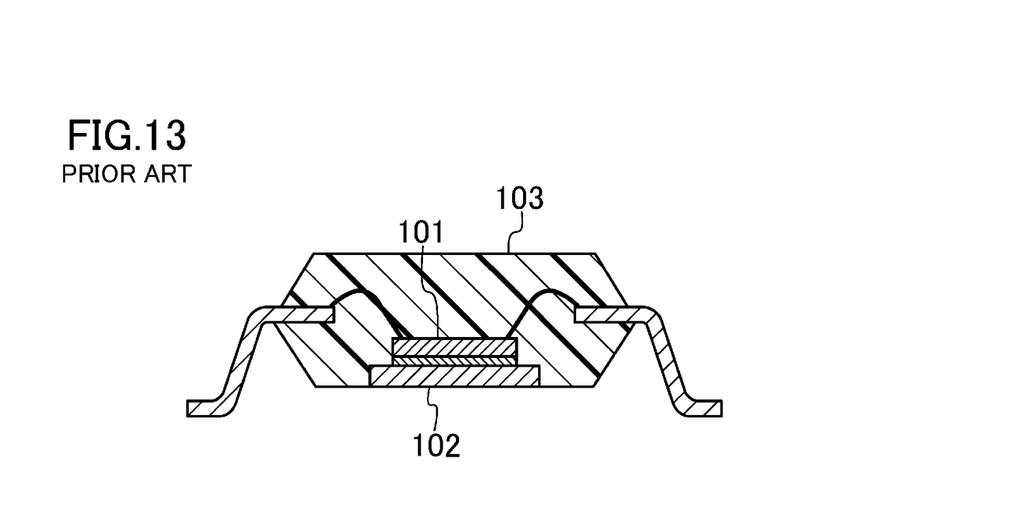
FIG. 13 is a cross-sectional view illustrating a semiconductor device according to a first conventional example.

For example, Patent Document 1 proposes a semiconductor device with a heat dissipation structure. As illustrated in FIG. 13, the semiconductor device of Patent Document 1 has a heat dissipation structure in which the back surface of a die pad 102 on which a semiconductor element 101 is mounted is exposed from an encapsulating resin 103.

Figure 14:
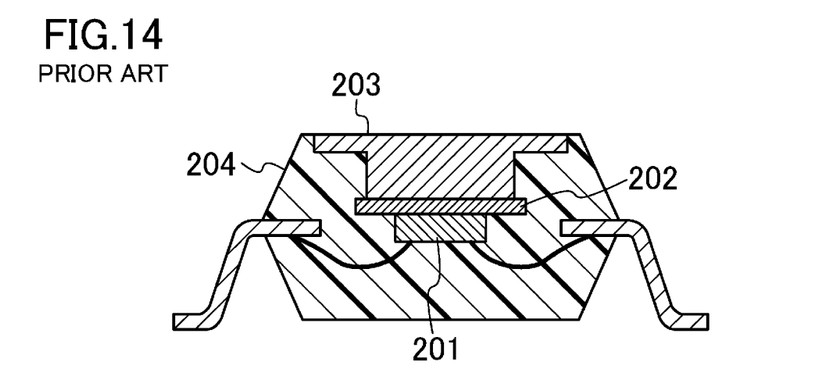
FIG. 14 is a cross-sectional view illustrating a semiconductor device according to a second conventional example.

Patent Document 2, for example, proposes another semiconductor device with a heat dissipation structure. As illustrated in FIG. 14, the semiconductor device of Patent Document 2 has a heat dissipation structure in which a die pad 202 on which a semiconductor element 201 having a large calorific value is mounted is connected to a heat dissipation member 203 and the heat dissipation member 203 is partially exposed from an encapsulating resin 204 sealing the semiconductor element 201.

In addition, Patent Document 3, for example, also proposes a semiconductor device. In the semiconductor device of Patent Document 3, a semiconductor element is mounted on a heat dissipation member including a first metal member of iron and a second metal member of copper penetrating the first metal member. This semiconductor device has a structure in which the semiconductor element is sealed by an encapsulating resin such that the heat dissipation member is partially exposed.

In operation of these conventional semiconductor devices, however, heat generated by the semiconductor elements increases the temperature, and a difference in thermal expansion coefficient causes thermal stress between the semiconductor element and the die pad or the heat dissipation member. This is because the thermal deformation amount of the die pad is larger than that of the semiconductor element. This thermal stress causes warpage of the semiconductor device. Accordingly, in addition to variation in characteristics of the semiconductor element, cracks occur in, for example, the semiconductor element, resulting in that reliability of the semiconductor device might degrade.

Patent Document 4, for example, proposes a semiconductor device with a structure for reducing thermal stress occurring in a semiconductor element. In the semiconductor device of Patent Document 4, part of a surface of a semiconductor element is supported by a columnar member to reduce thermal stress occurring in a semiconductor element, as compared to a case where the entire area of a surface of the semiconductor element is supported by, for example, a substrate.

Figure 15:
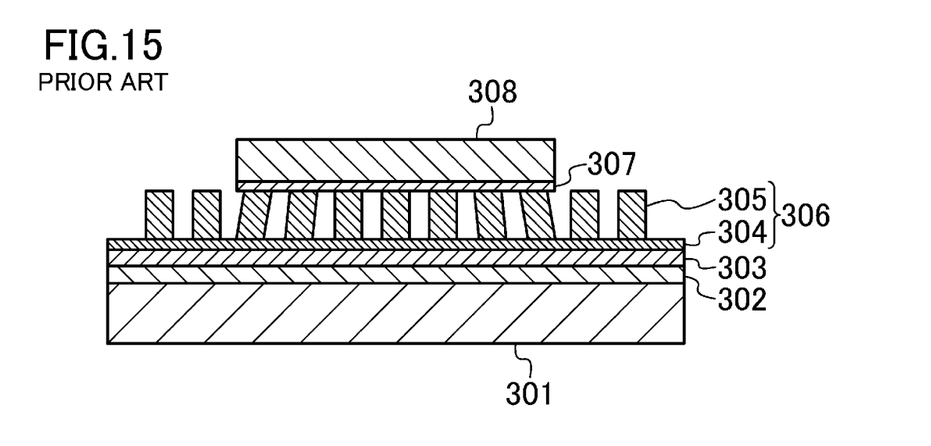
FIG. 15 is a cross-sectional view illustrating a semiconductor device according to a third conventional example.

Patent Document 5, for example, proposes a semiconductor device with a structure as described above to reduce thermal stress occurring in a semiconductor element and to release heat from the semiconductor element to the outside. As illustrated in FIG. 15, the semiconductor device of Patent Document 5 includes a heat dissipation member 306 provided on a metal substrate 301 of aluminium (Al) with an insulating layer 302 and solder 303 interposed therebetween. The heat dissipation member 306 is made of copper (Cu), and includes a plurality of columns 305 and a plate 304. A semiconductor element 308 is mounted on the columns 305 with solder 307 interposed therebetween. Heat generated in the semiconductor element 308 is transmitted from the columns 305 to the plate 304 through the solder 307, passes through the insulating layer 302, and is dissipated to the outside from the metal substrate 301. Here, copper constituting the heat dissipation member 306 and aluminium constituting the metal substrate 301 have thermal expansion coefficients larger than that of silicon dioxide ($SiO_2$) constituting the semiconductor element 308. Accordingly, when the temperatures of these components increase, the difference in thermal deformation amount causes thermal stress to be applied on the solder 307 connecting the semiconductor element 308 and the columns 305, thereby causing the possibility of a split or a breakage. In Patent Document 5, a copper wire is employed for the columns 305 to have the strength of the columns 305 lower than that of the solder 307, and thereby, the columns 305 in bending states support the semiconductor element 308. According to Patent Document 5, the above structure hardly causes thermal stress, and thus, can prevent warpage of the semiconductor element 308 due to the thermal stress.

CITATION LIST

Patent Document

[Patent Document 1] Japanese Patent Publication No. H11-251494
[Patent Document 2] Japanese Patent Publication No. H04-168753
[Patent Document 3] Japanese Patent Publication No. H07-211818
[Patent Document 4] Japanese Patent Publication No. H05-218133
[Patent Document 5] Japanese Patent Publication No. 2004-87612

SUMMARY OF THE INVENTION

Technical Problem

In the semiconductor device of Patent Document 5, however, heat generated in the semiconductor element is dissipated to outside the semiconductor device through the heat dissipation member and the insulating layer provided over substantially the entire upper surface of the metal substrate. Accordingly, in the semiconductor device of Patent Document 5, the advantages obtained by heat dissipation might be reduced. As a result, reliability of the semiconductor device might degrade. That is, in the semiconductor device of Patent Document 5, reduction of thermal stress occurring around the semiconductor element involves reduction of advantages of heat dissipation.

It is therefore an object of the present disclosure to provide a semiconductor device capable of reducing a stress caused by heat generated in a semiconductor element and obtaining effective heat dissipation and high reliability.

Solution to the Problem

To achieve the above object, a first semiconductor device according to the present disclosure includes: a plate having a through hole; a metal column fixed to the through hole with an insulating member interposed therebetween, and having a projection projecting from one surface of the plate; a semiconductor element fixed to the projection; a lead frame electrically connected to the semiconductor element; and a package covering the semiconductor element, and also covering at least part of each of the plate, the metal column, and the lead frame, wherein another surface of the plate is exposed from the package.

To achieve the above object, a second semiconductor device according to the present disclosure includes: a plate having a through hole; a metal column fixed to the through hole with an insulating member interposed therebetween, and having a projection projecting from one surface of the plate; a semiconductor element fixed to the projection; a lead frame electrically connected to the semiconductor element; a heat dissipation member fixed to another surface of the plate; and a package covering the semiconductor element, and also covering at least part of each of the plate, the metal column, the heat dissipation member, and the lead frame, wherein part of the heat dissipation member is exposed from the package.

To achieve the above object, a first method for manufacturing a semiconductor device according to the present disclosure includes: inserting a metal column into a through hole formed in a plate with an insulating member interposed therebetween such that part of the metal column projects from one surface of the plate to form a projection; fixing a semiconductor element to the projection; electrically connecting the semiconductor element to a lead frame; and forming a package covering the semiconductor element and also covering at least part of each of the plate and the lead frame such that another surface of the plate is exposed.

To achieve the above object, a second method for manufacturing a semiconductor device according to the present disclosure includes: inserting a metal column into a through hole formed in a plate with an insulating member interposed therebetween such that part of the metal column projects from one surface of the plate to form a projection; fixing a semiconductor element to the projection; fixing a heat dissipation member to another surface of the plate; electrically connecting the semiconductor element to a lead frame; and forming a package covering the semiconductor element and also covering at least part of each of the plate, the heat dissipation member, and the lead frame such that part of the heat dissipation member is exposed.

Effects of the Invention

A semiconductor device and a method for manufacturing the semiconductor device according to the present disclosure can reduce a stress due to heat generated in a semiconductor element, and exhibit effective heat dissipation and high reliability.

DESCRIPTION OF EMBODIMENTS

First Embodiment

A semiconductor device according to a first embodiment of the present disclosure will be described with reference to FIGS. 1-3.

Figure 1:
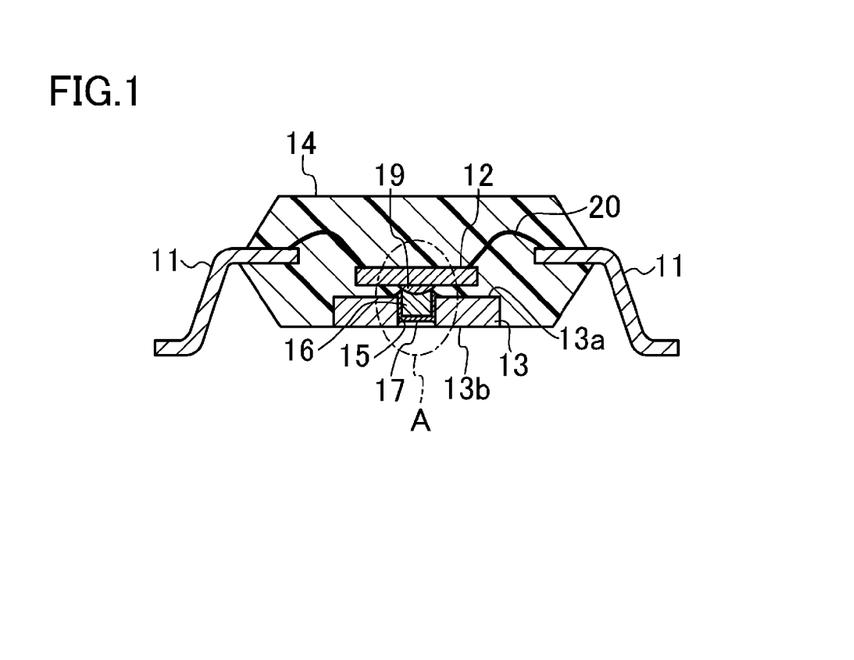
FIG. 1 is a cross-sectional view illustrating a semiconductor device according to a first embodiment of the present disclosure.
Figure 2:
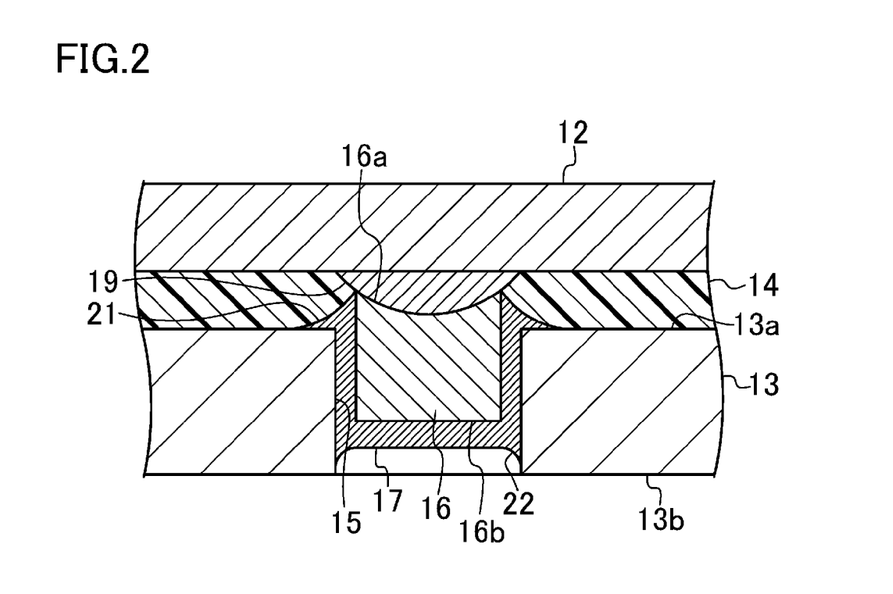
FIG. 2 is an enlarged cross-sectional view illustrating portion A of the semiconductor device of the first embodiment shown in FIG. 1.

As illustrated in FIGS. 1 and 2, the semiconductor device of this embodiment includes, at least, a semiconductor element 12, a lead frame 11 including a die pad 13 having a through hole 15, a cylindrical metal column 16 engaged in the through hole 15 with an insulating member 17 interposed therebetween, and a package 14. The die pad 13 is a plate made of, for example, copper and a copper alloy, and having a thickness of about 400 µm to about 500 µm. The die pad 13 has the cylindrical through hole 15 penetrating the die pad 13 from an upper surface 13a to a lower surface 13b thereof. The cylindrical metal column 16 of, for example, copper and a copper alloy is fixed to the through hole 15 with the insulating member 17 interposed therebetween. The fixing of the metal column 16 is achieved in such a manner that the metal column 16 is engaged in the through hole 15 with the insulating member 17 interposed therebetween, for example. The metal column 16 has a projection projecting from the upper surface 13a of the die pad 13. A semiconductor element 12 is fixed to the upper surface (the projection surface) 16a of the projection of the metal column 16 with a brazing material 19 interposed therebetween. The fixing of the semiconductor element 12 is achieved in such a manner that the semiconductor element 12 is attached to the upper surface 16a of the projection of the metal column 16 with the brazing material 19 interposed therebetween, for example. In the following description, attachment is employed as an example of a method for the fixing. The brazing material is, for example, a solder material based on tin (Sn)-silver (Ag)-bismuth (Bi). The upper surface (the projection surface) of the projection of the metal column 16 is a surface facing the semiconductor element 12.

The upper surface 13a of the die pad 13 as an example of the plate is an example of one surface of the plate, and the lower surface 13b of the die pad 13 is an example of the other surface of the plate.

Figure 3:
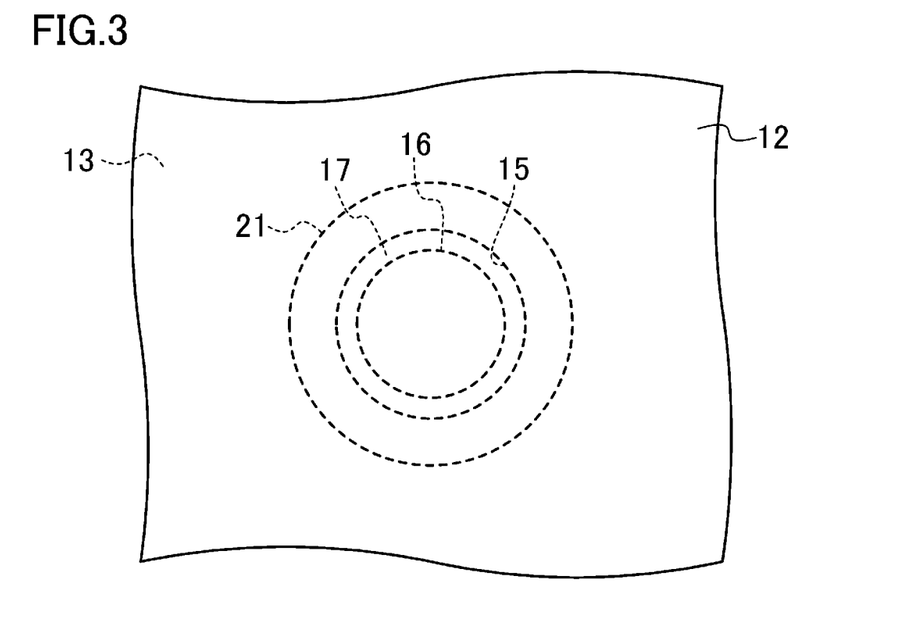
FIG. 3 is an enlarged plan view illustrating portion A of the semiconductor device of the first embodiment shown in FIG. 1.

As illustrated in FIGS. 2 and 3, one semiconductor element 12 is supported by one metal column 16 at the center thereof. In FIG. 3, the brazing material 19 and the package 14 are not shown for simplicity. The thickness of the semiconductor element 12 is 200 μm, for example, and the diameter of the metal column 16 is 3 mm, for example. The semiconductor element 12 is provided with a bonding pad (not shown), which is electrically connected to the lead frame 11 of, for example, copper by a metal member 20 made of a wire. The semiconductor element 12 and part of the lead frame 11 including the die pad 13 are sealed in the package 14 which is, for example, an encapsulating resin. The lower surface 13b of the die pad 13 is exposed from the package 14.

The insulating member 17 is made of a mixture of, a low-melting-point glass and alumina ($Al_2O_3$) powder. Since the insulating member 17 contains alumina, the thermal conduction of the insulating member 17 is higher than that of general low-melting-point glass.

The metal member 20 is, for example, an aluminium wire. Alternatively, the metal member 20 may be an aluminium ribbon or a copper clip. The aluminium ribbon and the copper clip have cross sections larger than that of the aluminium wire, and thus, have wiring resistances lower than that of the aluminium wire. Accordingly, the use of aluminium ribbon or the copper clip can reduce a loss of electric power.

The package 14 is, for example, an encapsulating resin of a biphenyl-based or cresol novolac-based thermosetting resin. The package 14 seals the semiconductor element 12, the metal member 20, and part of the lead frame 11, thereby integrating the lead frame 11 and the semiconductor element 12. The package 14 can also protect the semiconductor element 12.

The semiconductor element 12 can be, for example, an insulated gate bipolar transistor (an IGBT), or a power metal oxide semiconductor field effect transistor (a power MOSFET). In this embodiment, the semiconductor element 12 is a lateral power MOSFET incorporating a diode. The semiconductor element 12 generates heat by high-speed switching operation using large current. The generated heat is transmitted to the die pad 13, thereby increasing the temperature of the die pad 13. The metal material, e.g., copper, constituting the die pad 13 has a thermal expansion coefficient larger than that of a semiconductor material, e.g., silicon (Si), constituting the semiconductor element 12, and thus, the thermal deformation amount of the die pad 13 is larger than that of the semiconductor element 12. As a result, a large stress is generated at the connection between the semiconductor element 12 and the die pad 13. In the semiconductor device of this embodiment, the surface area of the upper surface 16a of the metal column 16 supporting the semiconductor element 12 is smaller than that of the back surface of the semiconductor element 12. That is, the semiconductor element 12 and the die pad 13 are connected to only part of the semiconductor element 12 through the metal column 16, thereby reducing a stress generated at the connection between the semiconductor element 12 and the die pad 13.

In the semiconductor device of this embodiment, the gasp between the semiconductor element 12 and the die pad 13 is filled with an encapsulating resin serving as the package 14. This filling with the encapsulating resin can strengthen the adhesion between the semiconductor element 12 and the die pad 13, thereby preventing entering of moisture or the like from the outside.

In addition, the encapsulating resin sandwiches the semiconductor element 12 at the top and bottom thereof, thereby ensuring uniformity in pressure applied on the semiconductor element 12 in filling with the encapsulating resin. As a result, the semiconductor device of this embodiment, residual strain occurring in the semiconductor element 12 can be reduced. Further, in this embodiment, since only one metal column 16 is used, the gap between the semiconductor element 12 and the die pad 13 can be easily filled with the encapsulating resin.

Furthermore, since the metal column 16 supports the center of the semiconductor element 12, the gap between the semiconductor element 12 and the die pad 13 is filled with the package 14 which is the encapsulating resin and enclosing the metal column 16 at the center thereof. As a result, it is possible to allow a pressure to be applied to the semiconductor element 12 more uniformly.

In the semiconductor device of this embodiment, heat generated in the semiconductor element 12 is dissipated from the lower surface of the die pad 13 through the metal column 16, the insulating member 17 containing alumina, and the package 14 of the encapsulating resin. Accordingly, as compared to a conventional structure of a semiconductor device in which an insulating layer is formed over the entire upper surface of the substrate, the semiconductor device of this embodiment has a high heat-dissipation property.

A structure of the connection between the semiconductor element 12 and the metal column 16 in the semiconductor device of the first embodiment will now be described in detail.

As illustrated in FIG. 2, the metal column 16 is engaged in the through hole 15 of the die pad 13 with the insulating member 17 interposed therebetween, and partially (i.e., a projection of the metal column 16) projects from the upper surface 13a of the die pad 13. The height of the projection of the metal column 16 is in the range from 70 μm to 100 μm, for example. The lower surface 16b of the metal column 16 at the opposite side of the upper surface 16a is located above the lower surface 13b of the die pad 13.

The insulating member 17 is provided in such a manner that at least the upper surface 16a of the metal column 16 is exposed. Specifically, the insulating member 17 is formed on the bottom of the metal column 16 and between the wall surface of the through hole 15 and the side surface of the metal column 16, thereby electrically insulating the metal column 16 and the die pad 13 from each other. Accordingly, in this embodiment, even when the semiconductor element 12 is operated with large current, no current flows in the die pad 13, resulting in reducing malfunction of the semiconductor element 12.

A fillet 22 of the insulating member 17 is formed at a place where the insulating member 17 and the wall surface of the through hole 15 are connected near the lower surface 16b of the metal column 16. Likewise, a fillet 21 of the insulating member 17 is formed at the periphery of the through hole 15 on the upper surface 13a of the die pad 13. These fillets 21 and 22 can more firmly connect the metal column 16 and the die pad 13.

If the fillet 22 flowed to the outside of the through hole 15, a step would be formed in the lower surface 13b of the die pad 13. This step in the lower surface 13b of the die pad 13 would cause problems of unstability in mounting the semiconductor device of this embodiment on another device, for example. To prevent these problems, it is preferable that the lower surface 16b of the metal column 16 is located above (when viewed in the drawing sheet of FIG. 2) the lower surface 13b of the die pad 13 and the distance from the lower surface 13b of the die pad 13 to the lower surface of the insulating member 17 covering the lower surface 16b of the metal column 16 is about 10 μm or more, as described above.

It is also preferable to form a concaved depression (a recess) in the upper surface 16a of the metal column 16. The radius of curvature of this depression in the upper surface 16a is, for example, 10 mm, and the depth of the depression is, for example, in the range from 10 μm to 20 μm. Such a depression can prevent the brazing material 19 from flowing out from the upper surface 16a of the metal column 16 to the die pad 13 in melting the brazing material 19. In addition, if the brazing material 19 flows from the upper surface 16a of the metal column 16, the fillet 21 formed between the metal column 16 and the upper surface 13a of the die pad 13 can prevent a short circuit from occurring between the semiconductor element 12 and the die pad 13. The insulating member 17 covers the periphery of the through hole 15.

In the semiconductor device of this embodiment, the through hole 15 is provided in the die pad 13. Alternatively, instead of the through hole 15, a recess may be formed. However, when the metal column is engaged in the recess, air in the recess might form bubbles in the insulating member 17. In view of this, the through hole 15 is preferably provided in the die pad 13.

In the semiconductor device of this embodiment, a stress due to heat generated in the semiconductor element 12 can be reduced, thereby achieving effective heat dissipation and high reliability.

A method for manufacturing a semiconductor device according to this embodiment will be described hereinafter with reference to FIGS. 4-6.

The method for manufacturing a semiconductor device according to this embodiment includes lead frame formation, die pad processing, dice bonding, wire bonding, molding, and lead frame processing. The lead frame formation, the dice bonding, the wire bonding, the molding, and the lead frame processing are known processes, and thus, will not be described hereinafter, and the die pad processing will be specifically described.

Figure 4:
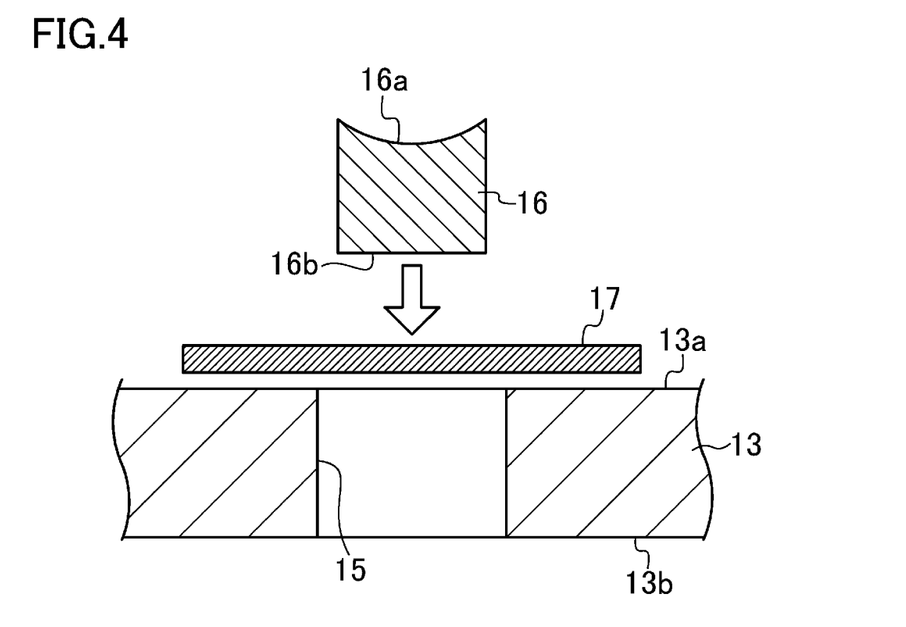
FIG. 4 is a cross-sectional view showing a process step of a method for manufacturing a semiconductor device according to the first embodiment.

First, as illustrated in FIG. 4, an insulating member 17 is placed over an upper surface 13a of a die pad 13, which is a plate having a cylindrical through hole 15, to cover the through hole 15. The insulating member 17 is a disk-shape member having a diameter larger than the opening diameter (e.g., 3 mm) of the through hole 15. Specifically, the insulating member 17 has an area larger than the opening area of the through hole 15. The diameter of the insulating member 17 is preferably approximately equal to the sum of the opening diameter of the through hole 15 and the depth (i.e., the thickness of the die pad 13) of the through hole 15. The use of the insulating member 17 having such a diameter ensures that the insulating member 17 is located between a metal column 16 and the die pad 13 in a subsequent process.

Then, the position of the lower surface 16b of the cylindrical metal column 16 having a diameter of, for example, 3 mm is adjusted relative to the through hole 15. In this adjustment, since the metal column 16 has been formed by, for example, punching, a burr is created on the upper surface 16a, and a depression (a recess) whose center is lower than the surrounding area is formed in the upper surface 16a. This depression (the recess) in the upper surface 16a has a radius of curvature of, for example, 10 mm, and a depth of, for example, 10 μm to 20 μm.

Figure 5:
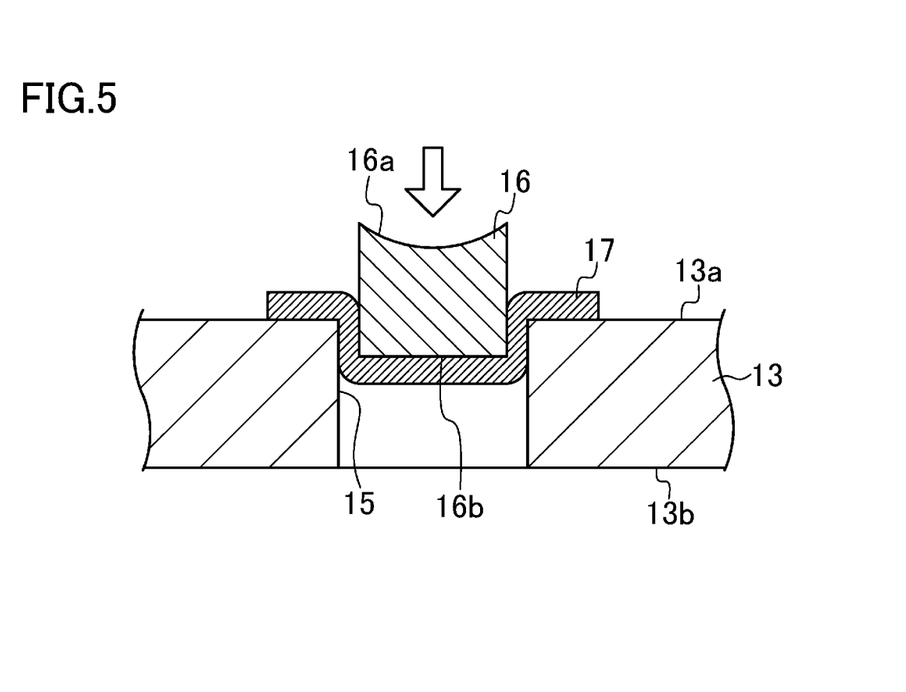
FIG. 5 is a cross-sectional view showing a process step of the method for manufacturing a semiconductor device according to the first embodiment.

Thereafter, as illustrated in FIG. 5, the lower surface 16b of the metal column 16 is brought into contact with the insulating member 17, and the metal column 16 is inserted into the through hole 15 with the insulating member 17 heated. In this process, the insulating member 17 is kept at a temperature higher than or equal to the softening temperature (i.e., about 300° C.) and lower than or equal to the melting temperature (i.e., about 350° C.). While the metal column 16 is inserted into the through hole 15, the insulating member 17 is also inserted into the through hole 15 together with the metal column 16 while being bent. The insulating member 17 is heated to be softened by, for example, applying laser light onto the insulating member 17 or heating the die pad 13. To deform the insulating member 17 with stability, it is preferable to heat the metal column 16 so as to indirectly heat the insulating member 17.

The above insertion of the metal column 16 into the through hole 15 is preferably performed with the upper portion of the metal column 16 kept above the insulating member 17 (when viewed in the drawing sheet of FIG. 5) on the die pad 13. Specifically, it is preferable that the upper portion of the metal column 16 is not inserted below (when viewed in the drawing sheet of FIG. 5) the insulating member 17 on the upper surface 13a of the die pad 13. By inserting the metal column 16 in the above manner, it is possible to prevent the insulating member 17 from entering the depression in the upper surface (the projection surface) 16a of the metal column 16 in melting the insulating member 17 in a subsequent process step.

Figure 6:
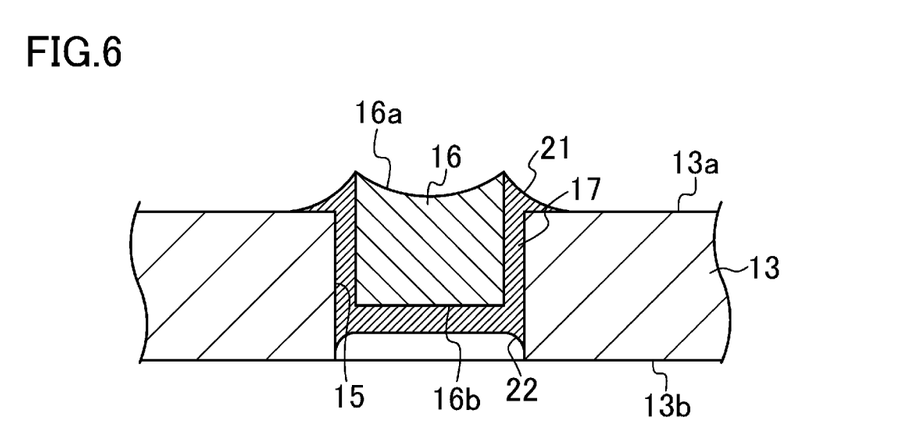
FIG. 6 is a cross-sectional view showing a process step of the method for manufacturing a semiconductor device according to the first embodiment.

Subsequently, as illustrated in FIG. 6, the insulating member 17 is heated to its melting temperature (i.e., about 350° C.) or more to be melted. In this manner, a fillet 21 is formed at the periphery of the through hole 15 on the upper surface 13a of the die pad 13, and a fillet 22 is formed at the connection between the insulating member 17 and the wall surface of the through hole 15 near the lower surface 16b of the metal column 16, thereby engaging the metal column 16 in the through hole 15.

Through the foregoing process steps, the die pad 13 of the semiconductor device of this embodiment is processed.

Then, dice bonding, wire bonding, molding, and lead frame processing are performed, thereby manufacturing a semiconductor device of this embodiment.

In a case where a conduction part between another device, for example, and the back surface of the semiconductor element 12 is needed, the metal column 16 may be partially exposed (projected) from the insulating member 17 having a hole at its center to outside the package 14. In this case, the insulating member 17 is likely to be also adhered to the exposed part of the metal column 16, and thus, an additional process of removing the insulating member 17 from the exposed part of the metal column 16 is preferably performed.

With the method for manufacturing a semiconductor device of the first embodiment, a semiconductor device in which a stress due to heat generated in a semiconductor element is reduced and which exhibits effective heat dissipation and high reliability can be obtained.

Variation of First Embodiment

In the first embodiment, the metal column 16 in which the depression (the recess) is previously formed in the upper surface 16a is inserted into the through hole 15. Alternatively, a depression may be formed in the upper surface of the metal column 16 at the same time as the insertion into the through hole 15. A method for manufacturing a semiconductor device according to a variation of the first embodiment employing the method of forming a depression concurrently with insertion will be described with reference to FIGS. 7-9. In this variation, same processes as those in the first embodiment will be briefly described or will not be described, and different aspects will be specifically described.

Figure 7:
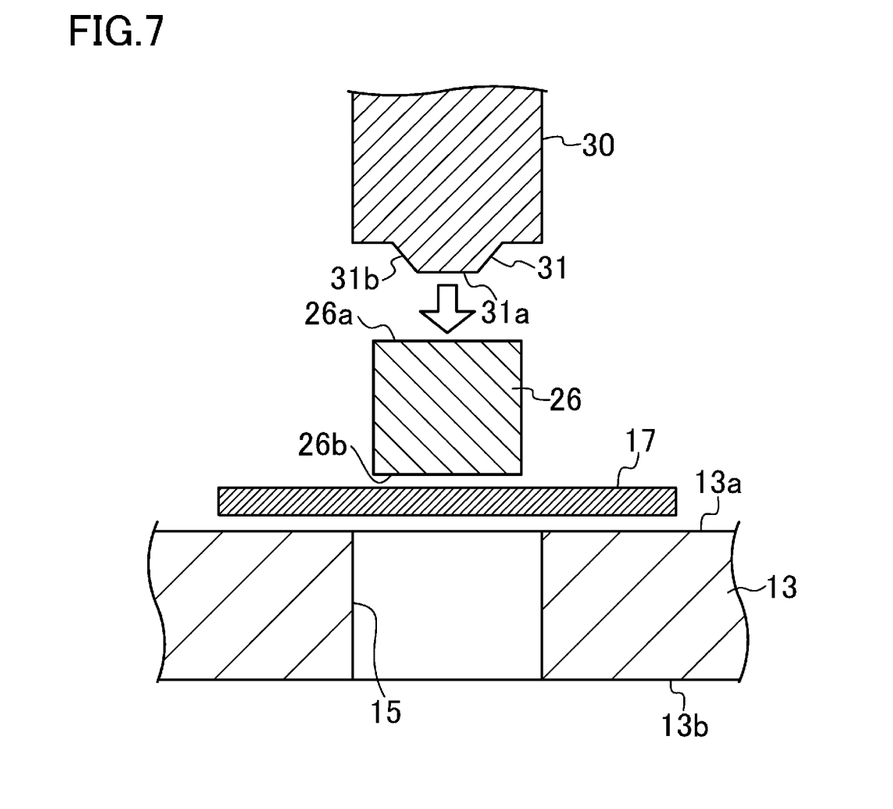
FIG. 7 is a cross-sectional view showing a process step of a method for manufacturing a semiconductor device according to a variation of the first embodiment.

As illustrated in FIG. 7, in the die pad processing of this variation, a metal column 26 is inserted into a through hole 15 of a die pad 13 using an insertion pin 30 having a projection 31 at the center of the tip thereof. The length of the projection 31 (i.e., the upward and downward direction of the drawing sheet of FIG. 7) is, for example, in the range from 10 µm to 20 µm, and the diameter (i.e., the length of the lateral direction of the drawing sheet of FIG. 7) of a tip surface 31a of the projection 31 is, for example, 1 mm. The side surface 31b of the projection 31 is tilted relative to the direction vertical to the tip surface 31a, and the tilt angle is, for example, 45°. Unlike the first embodiment, a concaved depression does not need to be formed in an upper surface 26a of the metal column 26 and the upper surface 26a may be flat in this variation.

First, as illustrated in FIG. 7, an insulating member 17 is placed on an upper surface 13a of the die pad 13 to cover the through hole 15 of the die pad 13. Thereafter, the position of the lower surface 26b of the metal column 26 is adjusted relative to the through hole 15.

Figure 8:
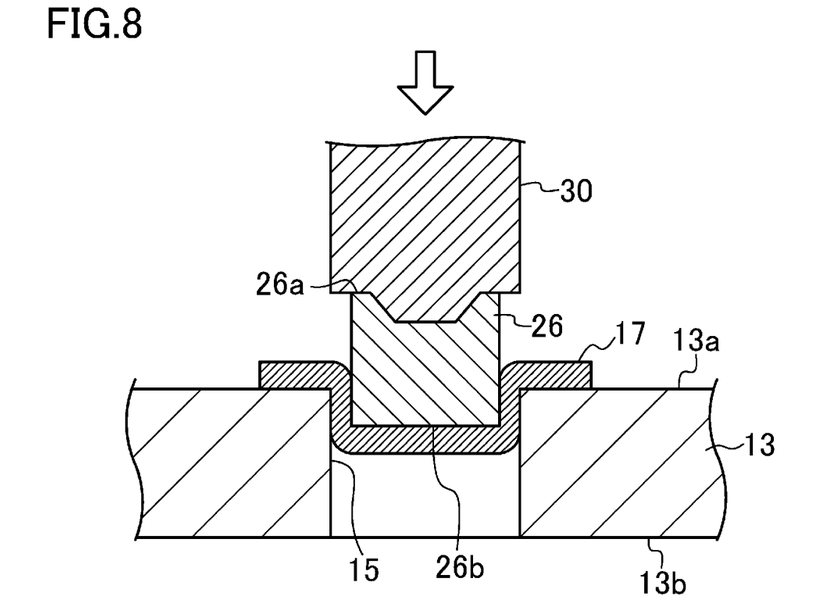
FIG. 8 is a cross-sectional view showing a process step of a method for manufacturing a semiconductor device according to the variation of the first embodiment.

Then, as illustrated in FIG. 8, the projection 31 of the insertion pin 30 is brought into contact with the upper surface 26a of the metal column 26, and the metal column 26 is inserted into the through hole 15 with the insulating member 17 heated. In this process step, the insulating member 17 is kept at a temperature higher than or equal to the softening temperature (i.e., about 300° C.) and lower than or equal to the melting temperature (i.e., about 350° C.). While the metal column 26 is inserted into the through hole 15, the insulating member 17 is also inserted into the through hole 15 together with the metal column 26 while being bent.

Figure 9:
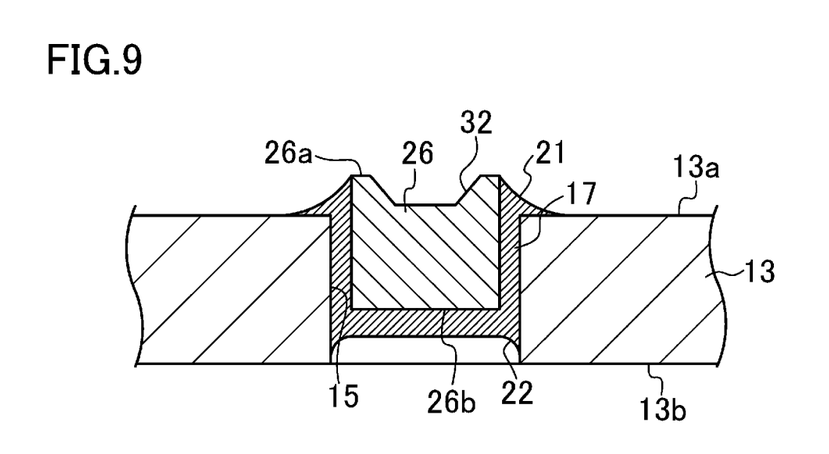
FIG. 9 is a cross-sectional view showing a process step of a method for manufacturing a semiconductor device according to the variation of the first embodiment.

As illustrated in FIG. 9, the insulating member 17 is then heated to its melting temperature (i.e., about 350° C.) or more to be melted. In this manner, a fillet 21 is formed at the periphery of the through hole 15 on the upper surface 13a of the die pad 13, and a fillet 22 is formed at the connection between the insulating member 17 and the wall surface of the through hole 15 on the lower surface 26b of the metal column 26, thereby engaging the metal column 26 in the through hole 15. Subsequently, the insertion pin 30 is removed from the metal column 26, thereby forming a recess 32 whose center is lower than the surrounding area in the upper surface 26a of the metal column 26. The depth of the recess 32 is, for example, in the range from 10 µm to 20 µm, and the diameter of the bottom of the recess 32 is, for example, 1 mm. The tilt angle of the tilted surface, which is the side surface of the recess 32, is 45°, for example.

In this variation, even in a configuration in which the upper surface 26a of the metal column 26 is flat, the insertion pin 30 having the projection 31 enables formation of the recess 32 in the upper surface 26a. Accordingly, even in the case of using a metal column having a flat upper surface, it is possible to prevent a brazing material 19 from flowing from the upper surface 26a of the metal column 26 to the die pad 13 in melting the brazing material 19.

In this variation, the tilt angle of the side surface of the projection 31 of insertion pin 30 is, for example, 45°, but may be larger or smaller than 45° as long as a flow of the brazing material 19 from the recess 32 can be prevented.

With the method for manufacturing a semiconductor device of the variation of the first embodiment, even in the case of using a metal column having a flat upper surface, a semiconductor device in which a stress due to heat generated in a semiconductor element can be reduced and which exhibits effective heat dissipation and high reliability can be obtained.

Second Embodiment

A semiconductor device according to a second embodiment of the present disclosure will be described hereinafter with reference to FIG. 10. In this embodiment, components already described in the first embodiment are designated by the same reference characters, and explanation thereof is not repeated.

Figure 10:
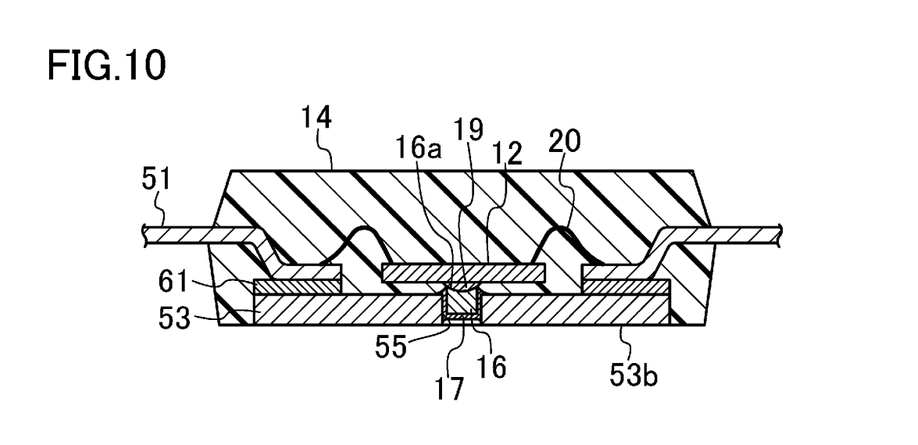
FIG. 10 is a cross-sectional view illustrating a semiconductor device according to a second embodiment of the present disclosure.

As illustrated in FIG. 10, the semiconductor device of the second embodiment is different from that of the first embodiment in that a through hole 55 is provided not in a die pad but in a heat dissipation plate 53, and that a metal column 16 is engaged in the through hole 55. This structure enables the semiconductor device of the second embodiment to incorporate a semiconductor element having a larger calorific value.

Specifically, the semiconductor device of this embodiment includes, at least, a lead frame 51, a semiconductor element 12, a heat dissipation plate 53 which is a plate having a through hole 55, a metal column 16 engaged in the through hole 55 with an insulating member 17 interposed therebetween, and a package 14. The lead frame 51 is made of a material having a high thermal conductivity, and includes a plurality of leads. The lead frame 51 is made of copper (Cu), for example. Ends of the leads of the lead frame 51 sealed in the package 14 project outward from the package 14. The heat dissipation plate 53 is made of a metal having a high thermal conductivity. The heat dissipation plate 53 of a metal having a high thermal conductivity is made of, for example, copper (Cu) and aluminium (Al). An insulating sheet 61 is formed on the heat dissipation plate 53. The lead frame 51 is attached to the heat dissipation plate 53 with the insulating sheet 61 interposed therebetween.

In this embodiment, the metal column 16 engaged in the through hole 55 of the heat dissipation plate 53 with the insulating member 17 interposed therebetween is provided, and the semiconductor element 12 is attached to an upper surface 16a of the metal column 16. The semiconductor element 12, the heat dissipation plate 53, and part of the lead frame 51 are sealed in the package 14, and a lower surface 53b of the heat dissipation plate 53 is exposed from the package 14. Specifically, the heat dissipation plate 53 is partially exposed from the package 14.

In the same manner as in the first embodiment, in the second embodiment, the surface area of the upper surface 16a of the metal column 16 supporting the semiconductor element 12 is smaller than that of the back surface of the semiconductor element 12. That is, the semiconductor element 12 and the heat dissipation plate 53 are connected to part of the semiconductor element 12 through the metal column 16, thereby reducing a stress generated at the connection between the semiconductor element 12 and the heat dissipation plate 53.

In the second embodiment, the heat dissipation plate 53 made of a material having a high thermal conductivity is employed. Accordingly, the resultant semiconductor device can exhibit effective heat dissipation.

A method for manufacturing a semiconductor device according to this embodiment, especially a process of engaging the metal column in the through hole of the heat dissipation plate, is the same as the process of engaging the metal column in the through hole of the die pad in the first embodiment. Thus, description thereof is not repeated.

Third Embodiment

A semiconductor device according to a third embodiment of the present disclosure will be described hereinafter with reference to FIG. 11. In this embodiment, components already described in the first embodiment are designated by the same reference characters, and explanation thereof is not repeated.

Figure 11:
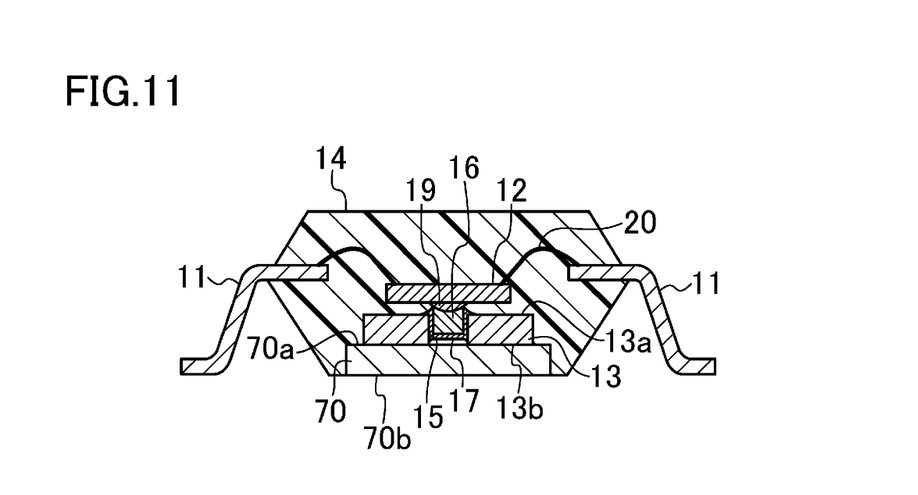
FIG. 11 is a cross-sectional view illustrating a semiconductor device according to a third embodiment of the present disclosure.

As illustrated in FIG. 11, as compared to the semiconductor device of the first embodiment, in the semiconductor device of this embodiment, a heat dissipation member 70 of a material having a high thermal conductivity, e.g., copper or aluminium, is attached to a lower surface 13b of a die pad 13, which is a plate. In the semiconductor device of this embodiment, the lower surface (i.e., the down-facing surface in the drawing sheet of FIG. 11) 70b of the heat dissipation member 70 is exposed from a package 14. The lower surface 70b of the heat dissipation member is the surface opposite to an upper surface (i.e., the up-facing surface in the drawing sheet of FIG. 11) 70a of the heat dissipation member 70 attached to the die pad 13. In this embodiment, since the heat dissipation member 70 having a high thermal conductivity is employed, heat is more effectively dissipated than in the first embodiment.

Next, a method for manufacturing a semiconductor device according to this embodiment will be described hereinafter with reference to FIG. 12.

Figure 12:
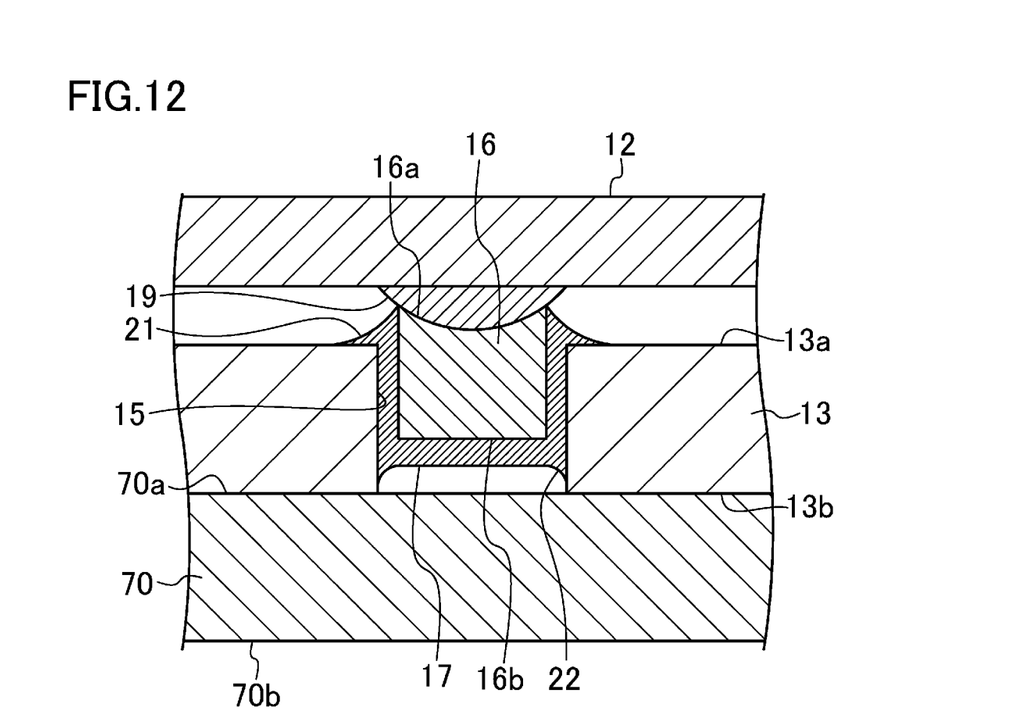
FIG. 12 is a cross-sectional view showing a process step of a method for manufacturing a semiconductor device according to the third embodiment.

In the method for manufacturing a semiconductor device of this embodiment, as compared to the method for manufacturing a semiconductor device of the first embodiment, a process of attaching the heat dissipation member 70 to the lower surface 13b of the die pad 13 is added, as illustrated in FIG. 12. This attachment can be performed before the semiconductor element 12 and other components are sealed in the package 14. For example, the attachment may be performed before engagement of the metal column 16 in the through hole 15 shown in FIGS. 4-6, or may be performed after engagement of the metal column 16 in the through hole 15 and before sealing by the package 14.

In the sealing by the package 14, the package 14 is formed such that the lower surface 70b of the heat dissipation member 70 is exposed therefrom.

INDUSTRIAL APPLICABILITY

A semiconductor device and a method for manufacturing a semiconductor device according to the present disclosure can reduce a stress due to heat generated in a semiconductor element and effectively dissipate heat, and thus, are useful especially as a semiconductor device in which a semiconductor element is sealed in a package and a method for manufacturing such a semiconductor device.

DESCRIPTION OF REFERENCE CHARACTERS 11, 51 lead frame
12 semiconductor element
13 die pad
13a, 16a, 26a, 70a upper surface
13b, 16b, 26b, 53b, 70b lower surface
14 package
15, 55 through hole
16, 26 metal column
17 insulating member
19 brazing material
20 metal member
21, 22 fillet
30 insertion pin
31 projection
31a tip surface
31b side surface
32 recess
53 heat dissipation plate
61 insulating sheet
70 heat dissipation member

The invention claimed is:

1. A semiconductor device, comprising:
a plate having a through hole;
a metal column fixed to the through hole with an insulating member interposed therebetween, and having a projection projecting from one surface of the plate;
a semiconductor element fixed to the projection;
a lead frame electrically connected to the semiconductor element; and
a package covering the semiconductor element, and also covering at least part of each of the plate, the metal column, and the lead frame, wherein
another surface of the plate is exposed from the package.

2. The semiconductor device according to claim 1, wherein the metal column has a recess in a surface thereof facing the semiconductor element fixed to the projection.

3. The semiconductor device according to claim 2, wherein the recess includes a bottom surface and a tilted surface tilted relative to the bottom surface.

4. The semiconductor device according to claim 1, wherein a fillet of the insulating member is formed at a periphery of the through hole on one surface of the plate.

5. The semiconductor device according to claim 1, wherein a fillet of the insulating member is formed at a connection between a wall surface of the through hole and the metal column.

6. The semiconductor device according to claim 1, wherein the lead frame is attached to the plate with an insulating sheet interposed therebetween.

7. The semiconductor device according to claim 1, wherein the plate is a die pad.

8. The semiconductor device according to claim 1, wherein the number of the metal column is one,
the single semiconductor element is fixed to the single metal column.

9. A semiconductor device, comprising:
a plate having a through hole;
a metal column fixed to the through hole with an insulating member interposed therebetween, and having a projection projecting from one surface of the plate;
a semiconductor element fixed to the projection;
a lead frame electrically connected to the semiconductor element;
a heat dissipation member fixed to another surface of the plate; and a package covering the semiconductor element, and also covering at least part of each of the plate, the metal column, the heat dissipation member, and the lead frame, wherein part of the heat dissipation member is exposed from the package.

10. A method for manufacturing a semiconductor device, the method comprising:
    inserting a metal column into a through hole formed in a plate with an insulating member interposed therebetween such that part of the metal column projects from one surface of the plate to form a projection;
    fixing a semiconductor element to the projection;
    electrically connecting the semiconductor element to a lead frame; and
    forming a package covering the semiconductor element and also covering at least part of each of the plate and the lead frame such that another surface of the plate is exposed.

11. The method according to claim 10, wherein in the inserting the metal column into the through hole with the insulating member interposed therebetween, an insertion pin having a projection at a tip thereof is employed, and the metal column is inserted into the through hole with the projection brought into contact with the metal column.

12. The method according to claim 11, wherein the projection of the insertion pin has a tilted side surface.

13. The method according to claim 10, wherein in the inserting the metal column into the through hole with the insulating member interposed therebetween, the insulating member having an area larger than an opening area of the through hole is inserted together with the metal column.

14. The method according to claim 10, wherein in the inserting the metal column into the through hole with the insulating member interposed therebetween, the metal column is inserted into the through hole such that part of the metal column is located above the insulating member on one surface of the plate.

15. The method according to claim 10, wherein in the inserting the metal column into the through hole with the insulating member interposed therebetween, a fillet of the insulating member is formed at a periphery of the through hole on another surface of the plate.

16. The method according to claim 10, wherein in the inserting the metal column into the through hole with the insulating member interposed therebetween, a fillet of the insulating member is formed at a connection between a wall surface of the through hole and the metal column.

17. A method for manufacturing a semiconductor device, the method comprising:
    inserting a metal column into a through hole formed in a plate with an insulating member interposed therebetween such that part of the metal column projects from one surface of the plate to form a projection;
    fixing a semiconductor element to the projection;
    fixing a heat dissipation member to another surface of the plate;
    electrically connecting the semiconductor element to a lead frame; and
    forming a package covering the semiconductor element and also covering at least part of each of the plate, the heat dissipation member, and the lead frame such that part of the heat dissipation member is exposed.

* * * * *